United States Patent
Karashima

(10) Patent No.: US 11,386,939 B2
(45) Date of Patent: Jul. 12, 2022

(54) READ DATA FIFO CONTROL CIRCUIT

(71) Applicant: MICRON TECHNOLOGY, INC., Boise, ID (US)

(72) Inventor: Ryoki Karashima, Hachioji (JP)

(73) Assignee: Micron Technology, Inc., Boise, ID (US)

(*) Notice: Subject to any disclaimer, the term of this patent is extended or adjusted under 35 U.S.C. 154(b) by 145 days.

(21) Appl. No.: 16/548,786

(22) Filed: Aug. 22, 2019

(65) Prior Publication Data

US 2021/0057005 A1 Feb. 25, 2021

(51) Int. Cl.
*G11C 7/10* (2006.01)
*G11C 7/22* (2006.01)
*G06F 3/06* (2006.01)
*G06F 11/10* (2006.01)

(52) U.S. Cl.
CPC .......... *G11C 7/1063* (2013.01); *G06F 3/0611* (2013.01); *G06F 3/0659* (2013.01); *G06F 3/0673* (2013.01); *G06F 11/1068* (2013.01); *G11C 7/109* (2013.01); *G11C 7/1069* (2013.01); *G11C 7/22* (2013.01)

(58) Field of Classification Search
CPC ....... G11C 7/1063; G11C 7/1069; G11C 7/22; G11C 7/109; G11C 11/4096; G11C 11/4093; G11C 7/1066; G11C 7/106; G11C 7/1039; G11C 11/4076; G06F 3/0673; G06F 11/1068; G06F 3/0611; G06F 3/0659; G06F 11/1048; G06F 5/10; G06F 13/1689

USPC ........................................................ 714/764
See application file for complete search history.

(56) References Cited

U.S. PATENT DOCUMENTS

| | | | | |
|---|---|---|---|---|
| 6,101,136 A | * | 8/2000 | Mochida | G11C 7/1018 365/194 |
| 6,889,334 B1 | * | 5/2005 | Magro | G11C 7/1051 324/130 |
| 7,587,640 B2 | * | 9/2009 | Mobin | G06F 13/4213 714/700 |
| 2010/0223514 A1 | * | 9/2010 | Nara | G11C 29/48 714/719 |
| 2010/0329049 A1 | * | 12/2010 | Sohn | G11C 7/22 365/194 |
| 2015/0380067 A1 | * | 12/2015 | Singh | G06F 13/1689 365/189.05 |
| 2019/0303042 A1 | * | 10/2019 | Kim | G11C 11/4087 |

* cited by examiner

*Primary Examiner* — James C Kerveros
(74) *Attorney, Agent, or Firm* — Dorsey & Whitney LLP

(57) ABSTRACT

Disclosed herein is an apparatus that includes a memory cell array configured to output a read data and a timing signal in response to a read command signal, an input counter configured to update an input count value in response to the timing signal, an output counter configured to update an output count value in response to the read command signal, and a data FIFO circuit having a plurality of data registers, the data FIFO circuit being configured to store the read data into one of the data registers indicated by the input count value and configured to output the read data stored in one of the data registers indicated by the output count value. The output counter is configured to maintain the output count value without updating in response to the read command signal when an active judge signal is in an inactive state.

21 Claims, 6 Drawing Sheets

READ DATA FIFO CONTROL CIRCUIT

BACKGROUND

In a memory device such as a DRAM including a plurality of memory banks, a so-called "pipeline operation" is performed in which operations of the memory banks overlap with each other to realize a high-speed operation. Meanwhile, an output circuit is shared by the memory banks. Therefore, a FIFO circuit is provided at a previous stage of the output circuit to enable data output from the memory banks to be sequentially output without collision.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

A FIFO circuit placed between a plurality of memory banks and an output circuit includes a plurality of data registers storing a plurality of read data corresponding to a plurality of read commands to the memory banks, respectively. Input and output of read data to and from the data registers is controlled by point values. Specifically, control is executed such that one of the data registers indicated by an input point value generated in response to a read command is indicated by a same output point value as the input point value also at a time of output to enable a read data to be output from the data register. For example, when a read data that is read from a first memory bank is stored into a first data register indicated by a first input point value, it is necessary to generate a first output point value same as the first input point value after a predetermined latency count and to output the read data from the first data register indicated by the first output point value. If the point values differ, a read data that is read from another memory bank having been previously accessed is output instead of the read data that is read from the first memory bank and correct read control cannot be executed. Normally, a read command is input to an activated memory bank (a plurality of memory cells are in a selected state). However, there is also a case where an illegal read command is input to a non-activated memory bank (no memory cells are in a selected state) and it is important to perform designing to prevent the point values from differing also in this case.

Figure 1:
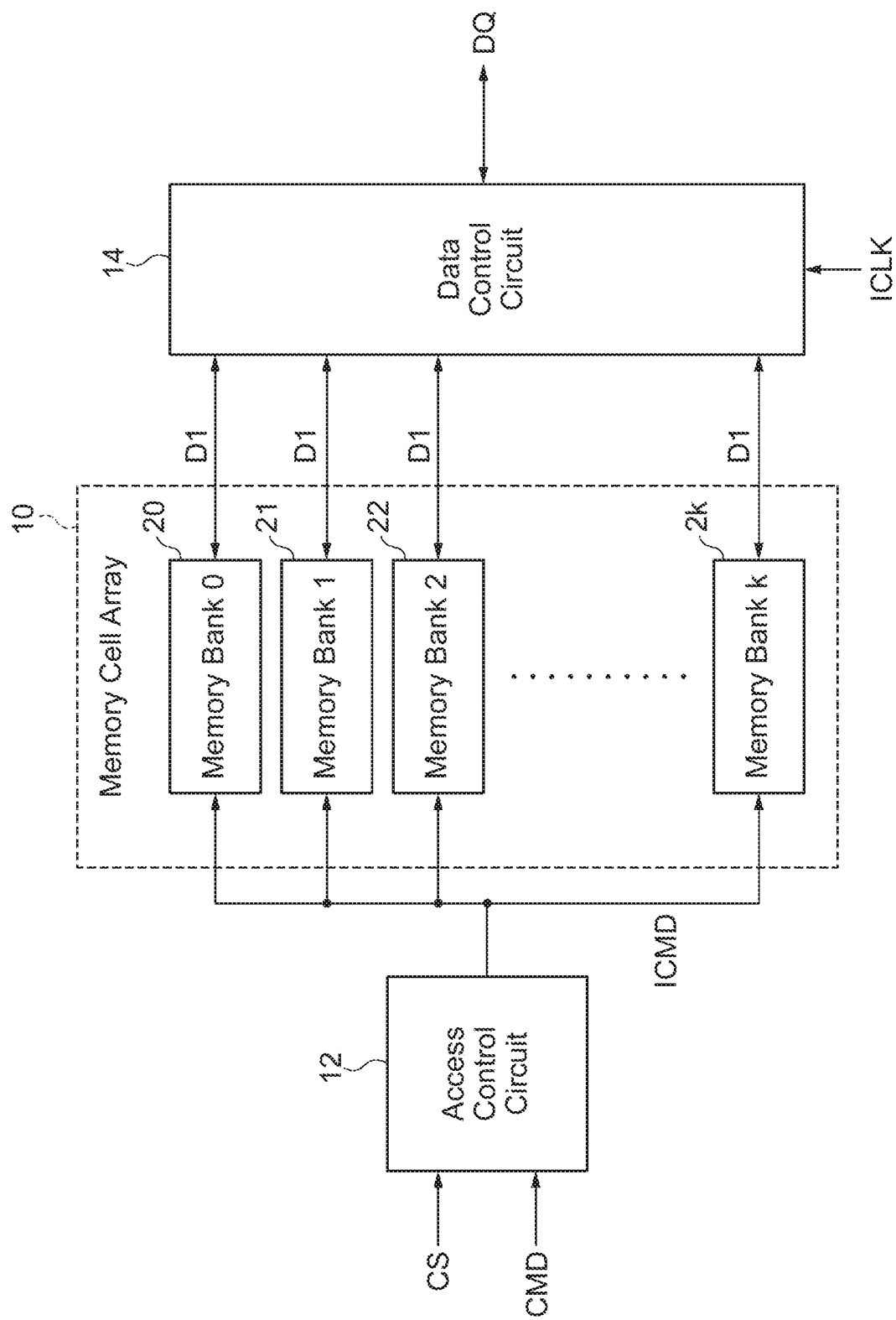
FIG. 1 is a block diagram showing an overall configuration of a semiconductor device according to the present disclosure.

A semiconductor device shown in FIG. 1 includes a memory cell array 10, an access control circuit 12 that performs an access operation to the memory cell array 10, and a data control circuit 14 that externally outputs read data D1 read from the memory cell array 10 and that supplies write data DQ externally input to the memory cell array 10. The memory cell array 10 is divided into k+1 memory banks 20 to 2k. Nonexclusive accesses can be performed to different memory banks. The access control circuit 12 generates an internal command signal ICMD on the basis of a chip select signal CS and an external command signal CMD, which are externally supplied, and performs a read access or a write access to the memory banks 20 to 2k on the basis of the internal command signal ICMD. When a read access is performed, an internal read data D1 is output from a selected one of the memory banks 20 to 2k. The internal read data D1 is asynchronous with a clock signal ICLK. The data control circuit 14 receives the internal read data D1 and outputs an external read data DQ synchronous with the clock signal ICLK to outside the semiconductor device.

Figure 2:
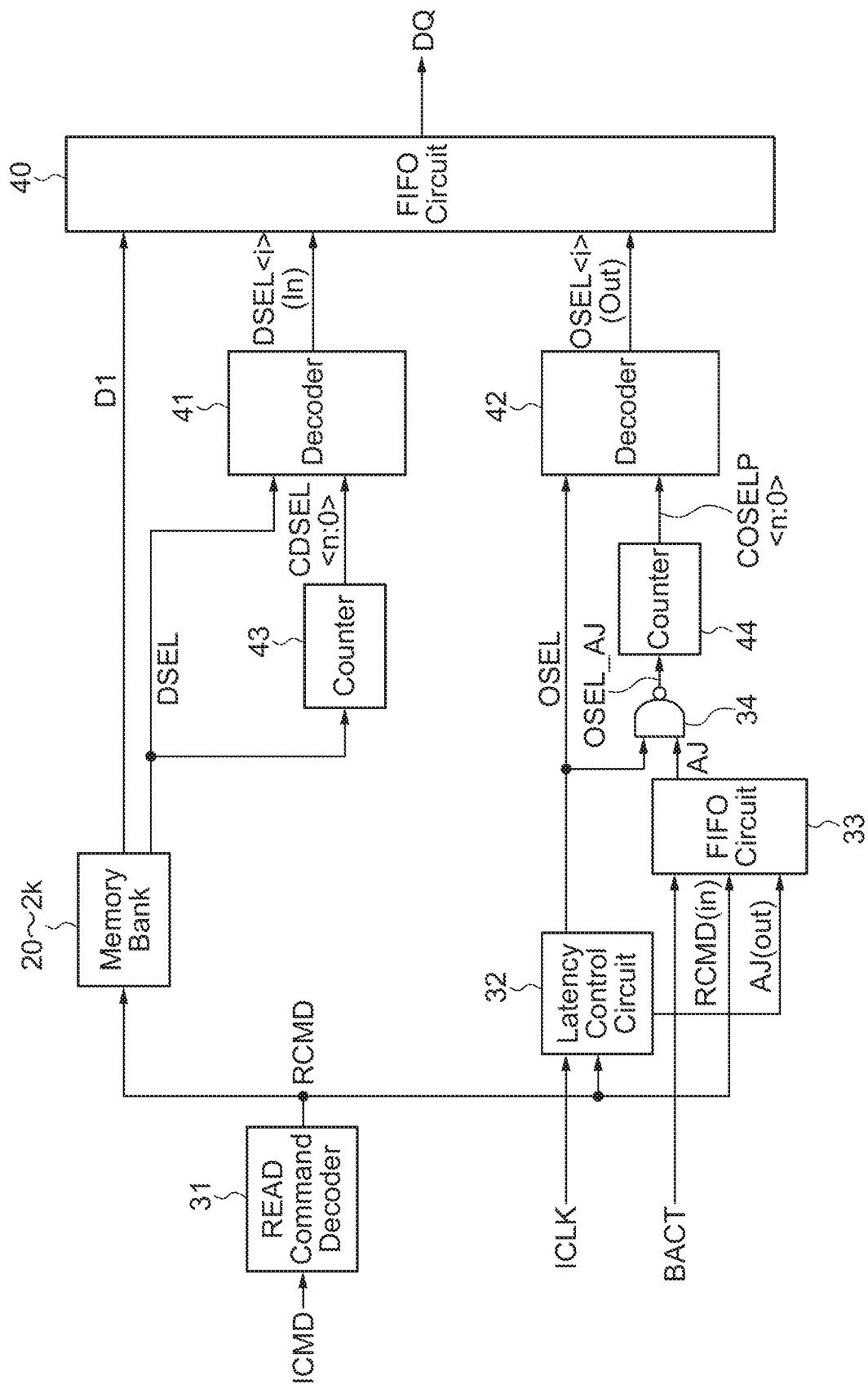
FIG. 2 is a block diagram illustrating a configuration of main parts of the semiconductor device according to the present disclosure.

As shown in FIG. 2, when the internal command signal ICMD is supplied to a read command decoder 31, the read command decoder 31 supplies a read command RCMD to a selected one of the memory banks 20 to 2k. In response thereto, the selected one of the memory banks 20 to 2k performs a read operation and outputs a data stored at an indicated address as the internal read data D1. At this time, the selected one of the memory banks 20 to 2k activates a timing signal DSEL synchronously with the internal read data D1. The internal read data D1 is supplied to a FIFO circuit 40. The FIFO circuit 40 is included in the data control circuit 14 shown in FIG. 1.

Figure 3:
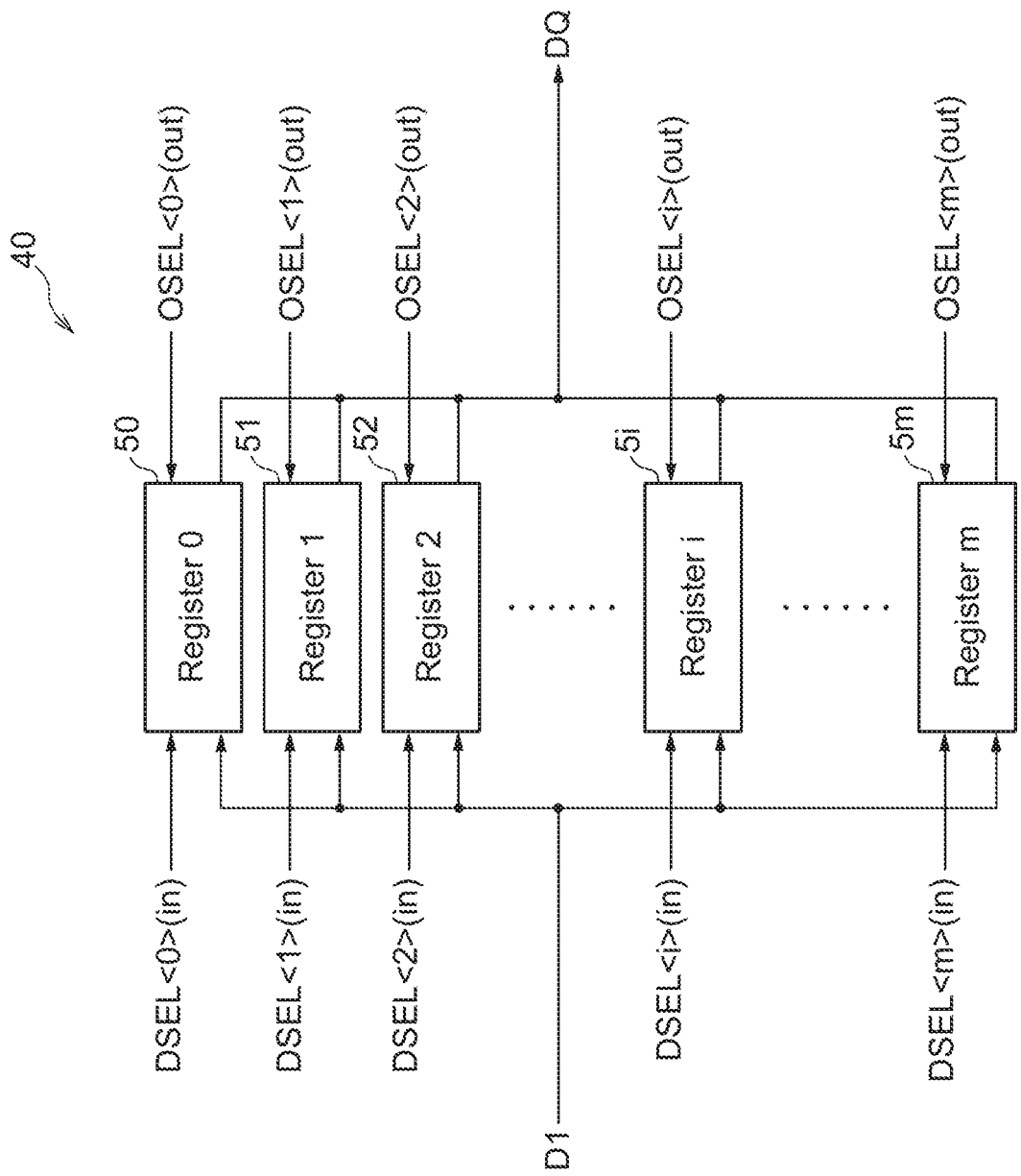
FIG. 3 is a block diagram illustrating a configuration of an FIFO circuit shown in FIG. 2.

As shown in FIG. 3, the FIFO circuit 40 has m+1 registers being registers 50 to 5m. The internal read data D1 is supplied in common to the registers 50 to 5m and the internal read data D1 is overwritten to one of the registers 50 to 5m indicated by an input point value DSEL<i>(in) (i=0 to m). The internal read data D1 stored into one of the registers 50 to 5m indicated by an output point value OSEL<i>(out) (i=0 to m) is output as the external read data DQ. The input point value DSEL<i>(in) and the output point value OSEL<i>(out) are generated by decoders 40 and 42 shown in FIG. 2, respectively. The decoder 41 decodes a count value CDSEL<n:0> of a counter 43 to generate the input point value DSEL<i>(in) and outputs the input point value DSEL<i>(in) to the FIFO circuit 40 synchronously with the timing signal DSEL. The decoder 42 decodes a count value COSELP<n:0> of a counter 44 to generate the output point value OSEL<i>(out) and outputs the output point value OSEL<i>(out) to the FIFO circuit 40 synchronously with a timing signal OSEL.

The timing signal OSEL is generated by delaying the read command RCMD through a latency control circuit 32. The latency control circuit 32 includes a shift register circuit and outputs the timing signal OSEL at a timing when the internal clock signal ICLK has been activated a predetermined number of times after the read command RCMD is generated. The timing signal OSEL indicates a timing when the internal read data D1 is output from the selected one of the memory banks 20 to 2n after the read command RCMD is activated, and is synchronous with the internal clock signal ICLK. While a timing of actually outputting the internal read data D1 is indicated by the timing signal DSEL, the timing signal DSEL is asynchronous with the internal clock signal ICLK. The latency control circuit 32 activates an active judge signal AJ(out) immediately before outputting the timing signal OSEL. The active judge signal AJ(out) is supplied to a FIFO circuit 33. The FIFO circuit 33 is a circuit that retains a bank active signal BACT, and uses a read command RCMD(in) as an increment signal for the input point value and uses the active judge signal AJ(out) as the output point value. The bank active signal BACT is a signal indicating whether the read command RCMD is issued to one of the memory banks 20 to 2k in an active state. When the read command RCMD is issued to one of the memory banks 20 to 2n in an inactive state, the read operation is not actually performed. Therefore, the active judge signal AJ output from the FIFO circuit 33 indicates whether the timing signal OSEL corresponding thereto is valid. When the active judge signal AJ synchronous with a certain timing signal OSEL is in a non-activated state (a low level), a count signal OSEL_AJ output from a NAND gate circuit 34 that receives the timing signal OSEL and the active judge signal AJ is fixed to a high level. Accordingly the count value of the counter 44 is not updated even when the timing signal OSEL is activated. When such an illegal access is performed, the timing signal DSEL is not output from the memory banks 20 to 2k and therefore no difference occurs between the count value of the counter 43 and the count value of the counter 44.

Figure 4:
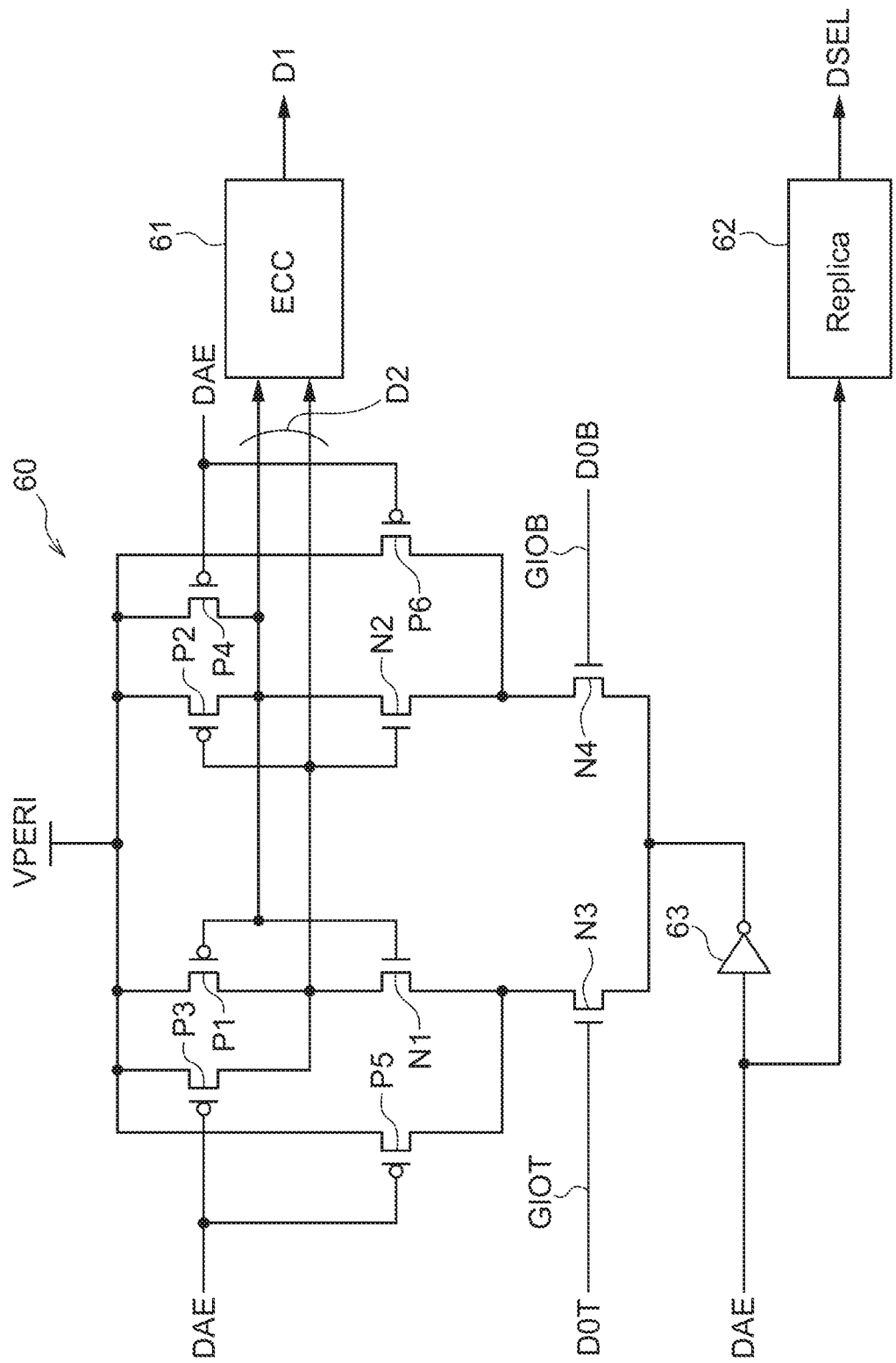
FIG. 4 is a circuit diagram of a data amplifier.

As shown in FIG. 4, the internal read data D1 is output in response to activation of a data amplifier enable signal DAE. A read data D0 read from a memory cell array in the memory banks 20 to 2k is supplied to a data amplifier 60. The data amplifier 60 has a configuration in which P-channel MOS transistors P1 and P2 and N-channel MOS transistors N1 and N2 are cross-coupled. A power supply potential VPERI is supplied to sources of the transistors P1 and P2. A source of the transistor N1 is connected to an output node of an inverter circuit 63 via an N-channel MOS transistor N3 and a source of the transistor N2 is connected to the output node of the inverter circuit 63 via an N-channel MOS transistor N4. Gate electrodes of the transistors N3 and N4 are connected to global I/O lines GIOT and GIOB supplied with read data D0T and D0B, respectively. The data amplifier enable signal DAE is supplied to the inverter circuit 63. With this configuration, when the data amplifier enable signal DAE changes to a high level, the data amplifier 60 is activated and a read data D2 is output from the data amplifier 60. The read data D2 is subjected to error correction processing by an error correction circuit 61 and is thereafter supplied as the internal read data D1 to the FIFO circuit 40. The data amplifier enable signal DAE is also supplied to a replica circuit 62. The replica circuit 62 provides a delay amount same as that of the error correction circuit 61 to the data amplifier enable signal DAB to generate the timing signal DSEL. Accordingly, a timing when the timing signal DSEL is activated matches an output timing of the internal read data D1. When the data amplifier enable signal DAE changes to a low level, P-channel MOS transistors P3 to P6 are turned on to inactivate the data amplifier 60.

Figure 5:
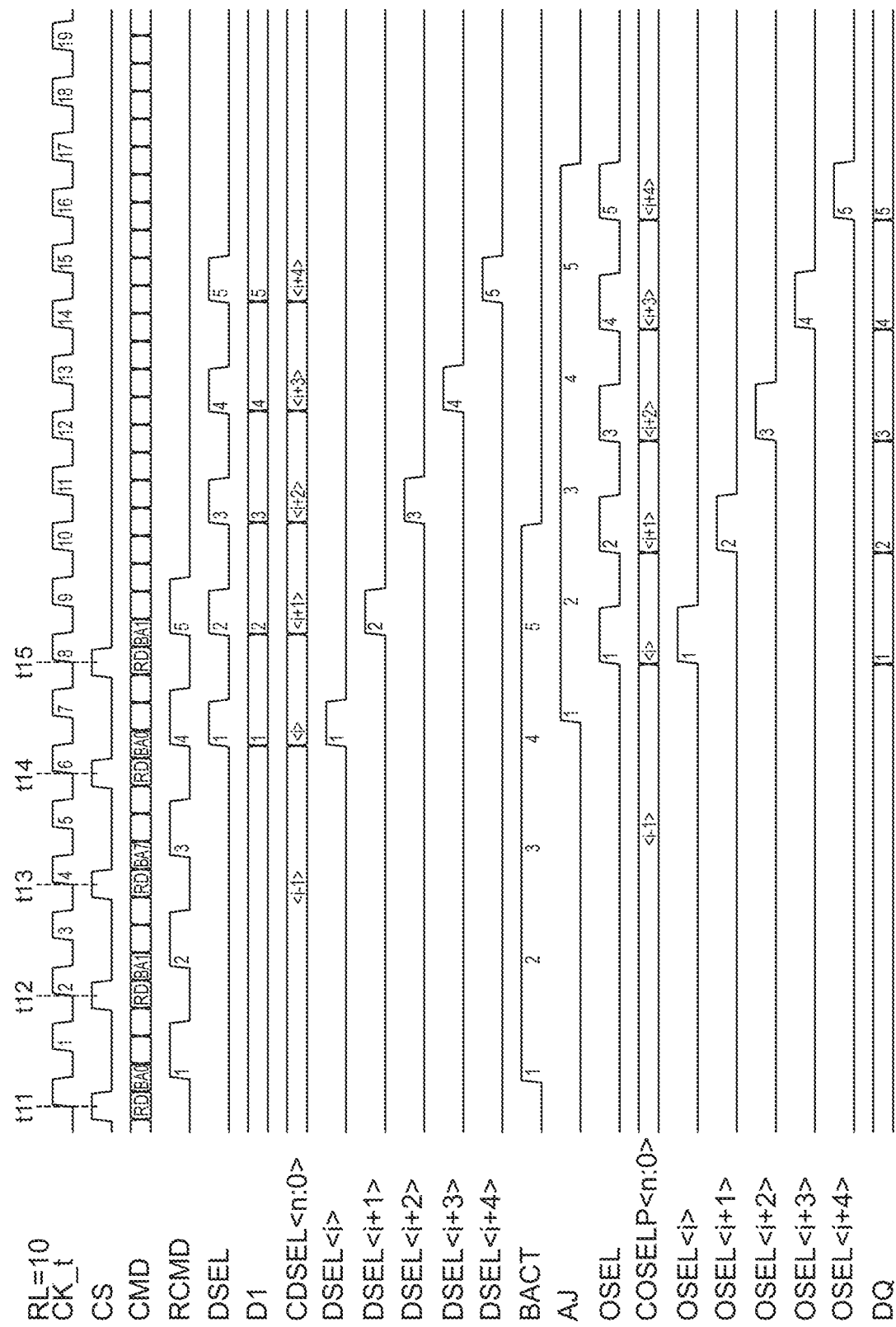
FIG. 5 and FIG. 6 are timing diagrams for explaining an operation of the semiconductor device according to the present disclosure.

An operation of the semiconductor device according to the present disclosure is explained next with reference to FIGS. 5 and 6. In an example shown in FIG. 5, a chip select signal CS is activated and a read command RD is issued at each of times t11 to t15. The read commands RD issued at the times t11 to t15 are all valid read commands RD. That is, the read commands RD are issued to memory banks in an active state. Accordingly, the bank active signal BACT is kept at a high level. In the example shown in FIG. 5, the read commands RD issued at the times t11 to t15 indicate bank addresses BA0, BA1, BA7, BA0, and BA1, respectively. When a read command RD is issued, the read command decoder 31 shown in FIG. 2 generates a read command RCMD. In the example shown in FIG. 5, because the read commands RD issued at the times t11 to t15 are all valid read commands RD, the corresponding memory banks start a read operation in response to the read commands RCMD, respectively. When the read operation is completed, the timing signal DSEL and the read data D1 are output from each of the corresponding memory banks. The timing signal DSEL is supplied to the counter 43 shown in FIG. 2, whereby the count value CDSEL<n:0> of the counter 43 is incremented. In the example shown in FIG. 5, the count value CDSEL<n:0> of the counter 43 is incremented to <i>, <i+1>, <i+2>, <i+3>, and <i+4> in this order. The decoder 41 decodes the count values CDSEL<n:0> of <i>, <i+1>, <i+2>, <i+3>, and <i+4> and activates the input point value DSEL<i>(in) synchronously with the timing signals DSEL. Therefore, in the example shown in FIG. 5, the input point value DSEL<i>(in) is activated in the order of <i>, <i+1>, <i+2>, <i+3>, and <i+4>.

The read commands RCMD are provided with a predetermined delay by the latency control circuit 32 and are output as the timing signals OSEL from the latency control circuit 32. In the examples shown in FIGS. 5 and 6, a read latency is 10 (RL=10). A timing when the timing signal OSEL is activated is slightly delayed from a timing when the timing signal DSEL is activated. Because the bank active signal BACT is kept at a high level in the example shown in FIG. 5, the active judge signal AJ is also kept at a high level. Accordingly each time the timing signal OSEL is activated, the count signal OSEL_AJ is also activated, whereby the count value COSELP<n:0> of the counter 44 is sequentially incremented. In the example shown in FIG. 5, the count value COSELP<n:0> of the counter 44 is incremented to <i>, <i+1>, <i+2>, <i+3>, and <i+4> in this order. The decoder 42 decodes the count value COSELP<n:0> of <i>, <i+1>, <i+2>, <i+3>, and <i+4> and activates the output point value OSEL<i>(out) synchronously with the timing signals OSEL. Therefore, in the example shown in FIG. 5, the output point value OSEL<i>(out) is activated in the order of <i>, <i+1>, <i+2>, <i+3>, and <i+4>.

Accordingly, the read data D1 output from the memory banks 20 to 2n are sequentially stored into the registers included in the FIFO circuit 40 and are sequentially selected to be output as the read data DQ.

Figure 6:
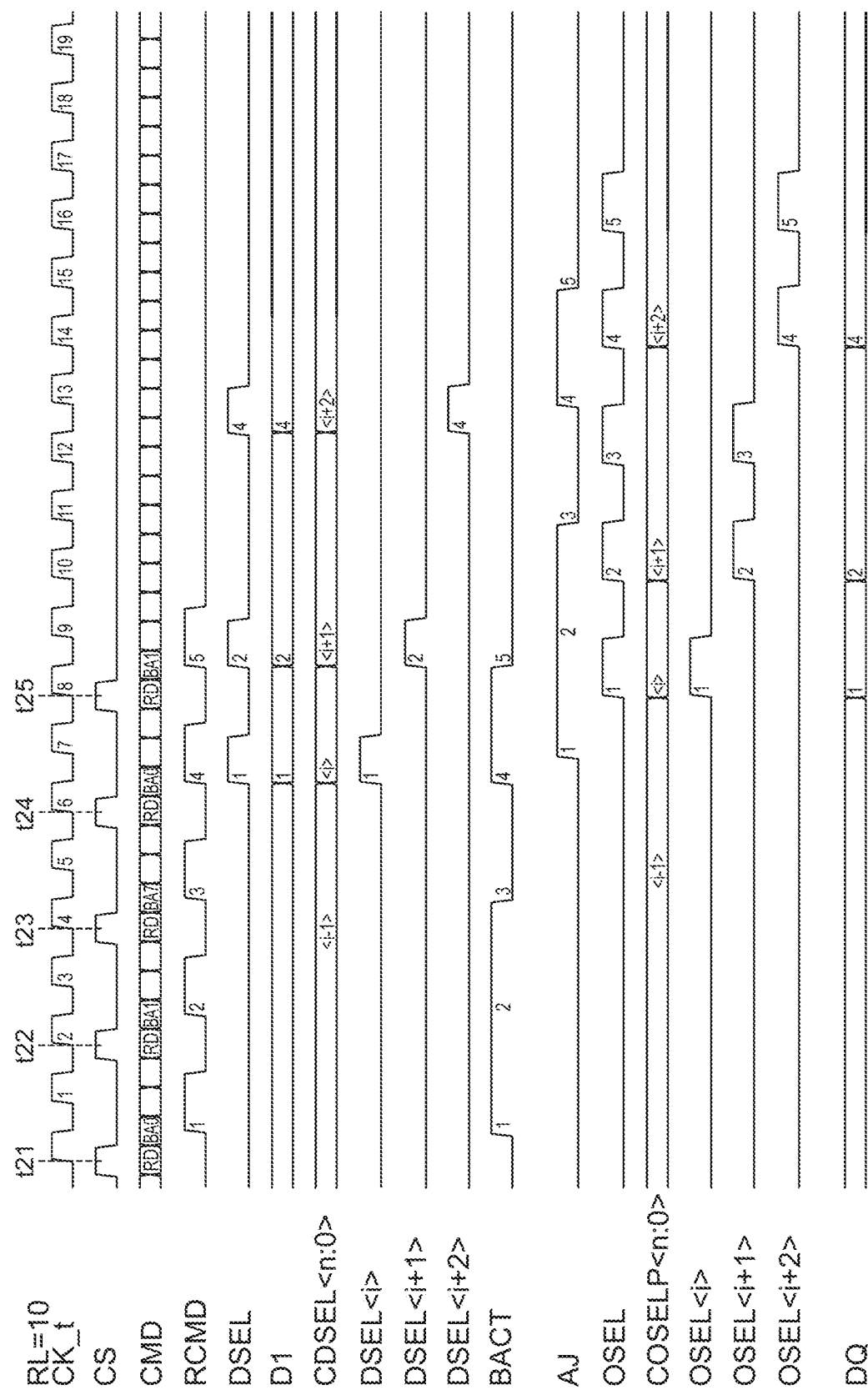

In the example shown in FIG. 6, the chip select signal CS is activated and the read command RD is issued at each of times t21 to t25. However, the read commands RD issued at the times t23 and t25 are both illegal read commands RD. That is, the read commands RD are issued to memory banks in an inactive state at the times t23 and t25. Accordingly the bank active signal BACT changes to a low level at the times t23 and t25. In this way, because the read commands RD issued at the times t23 and t25 are illegal read commands RD in the example shown in FIG. 6, read operations in response to these read commands RD are not performed and the timing signals DSEL and the read data D1 in response to these read commands RD are not output. Therefore, the count value CDSEL<n:0> of the counter 43 is not incremented in response to the illegal read commands RD. Accordingly, the count value CDSEL<n:0> of the counter 43 is incremented to <i>, <i+1>, and <i+2> in this order and the decoder 41 activates the input point value DSEL<i>(in) in the order of <i>, <i+1>, and <i+2> synchronously with the timing signals DSEL.

Meanwhile, the read command RCMD is provided with a predetermined delay by the latency control circuit 32 and is output as the timing signal OSEL from the latency control circuit 32, regardless of whether the read command RD is illegal. That is, even if the read command RD is illegal, the timing signal OSEL is activated after the predetermined latency is elapsed. However, when an illegal read command RD is issued, the bank active signal BACT changes to a low level and is accumulated in the FIFO circuit 33. Because the bank active signal BACT accumulated in the FIFO circuit 33 is output as the active judge signal AJ after the predetermined latency is elapsed, the count signal OSEL_AJ is not activated even when the timing signal OSEL is activated in response to the illegal read command RD. Accordingly, the count value COSELP<n:0> of the counter 44 is incremented in response to correct read commands RD. That is, the count value COSELP<n:0> of the counter 44 is incremented to <i>, <i+1>, and <i+2> in this order and the decoder 42 activates the output point value OSEL<i>(out) in the order of <i>, <i+1>, and <i+2> synchronously with the timing signals OSEL.

Accordingly, even in a case where an illegal read command RD is issued, the difference between the count value CDSEL<n:0> of the counter 43 and the count value COSELP<n:0> of the counter 44 is always kept constant.

As described above, the semiconductor device according to the present disclosure generates the input point value DSEL<i>(in) using the timing signal DSEL output from the memory banks 20 to 2n. Accordingly, a FIFO circuit for managing the read command RCMD is not required unlike in a case of generating the input point value DSEL<i>(in) using the read command RCMD. Meanwhile, the FIFO circuit 33 for managing the bank active signal BACT is required. However, the FIFO circuit 33 for managing the bank active signal BACT is a circuit that merely manages one bit of the bank active signal BACT and is thus sufficiently smaller in the circuit scale than a FIFO circuit for managing the read command RCMD.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a memory cell array configured to receive a read command signal and output a read data. and a timing signal in response to the read command signal, wherein the read data and the timing signal are different;
   an input counter configured to receive the timing signal and update an input count value in response to the timing signal;
   an output counter configured to receive a count signal and a judge signal and update an output count value in response to the count signal and the judge signal when the judge signal is in an active state, wherein the count signal is generated based on the read command signal, and wherein the output counter is configured to maintain the output count value when the judge signal is in an inactive state; and
   a data FIFO circuit having a plurality of data registers, the data FIFO circuit being configured to store the read data into one of the data registers indicated by an input point value and configured to output the read data stored in one of the data registers indicated by an output point value.

2. The apparatus of claim 1, wherein the memory cell array is configured to output the read data and the timing signal synchronously.

3. The apparatus of claim 2, further comprising a latency control circuit configured to delay the read command signal,
   wherein the memory cell array is supplied with the read command signal without delayed by the latency control circuit, and
   wherein the output counter is supplied with the read command signal delayed by the latency control circuit.

4. The apparatus of claim 3, wherein the read command signal delayed by the latency control circuit is activated after the timing signal is activated.

5. The apparatus of claim 3,
   wherein the memory cell array is divided into a plurality of memory banks, and
   wherein the judge signal is maintained at the inactive state when the read command signal is illegal where the read command signal is supplied to a non-activated one of the memory banks.

6. The apparatus of claim 5, wherein the memory cell array outputs neither the read data nor the tuning signal when the read command signal is illegal.

7. The apparatus of claim 1,
   wherein the memory cell array includes a data amplifier configured to output the read data in response to an amplifier enable signal, and
   the timing signal is generated based on the amplifier enable signal.

8. The apparatus of claim 7, Wherein the memory cell array further includes a logic circuit configured to process the read data and a replica circuit configured to delay the amplifier enable signal to generate the timing signal.

9. The apparatus of claim 8, wherein the logic circuit includes an error correction circuit configured to correct an error of the read data.

10. An apparatus comprising:
    a memory bank configured to output a read data and a timing signal in response to a first read command signal when the memory bank is in a first state, wherein the read data and the timing signal are different;
    a latency control circuit configured to generate a second read command signal by delaying the first read command signal:
    an input counter coupled to the memory bank, wherein the input counter is configured to receive the timing signal and update an input count value in response to the timing signal;
    an output counter coupled to the latency control circuit, wherein the output counter is configured to receive the second read command signal and update an output count value in response to the second read command signal;
    a data FIFO circuit having a plurality of data registers, the data FIFO circuit being configured to store the read data into one of the data registers indicated by an input point value and configured to output the read data stored in one of the data registers indicated by an output point value; and a judge circuit coupled to the output counter, wherein the judge circuit is configured to control the output counter such that the output counter stops updating the output count value in response to the second read command signal when the first read command signal is supplied to the memory bank in a second state different from the first state.

11. The apparatus of claim 10, wherein the first state is an active state, and wherein the second state is an inactive state.

12. The apparatus of claim 11, wherein the memory bank outputs neither the read data nor the timing signal when the first read command signal is supplied to the memory bank is in the second state.

13. The apparatus of claim 10, wherein the memory bank is configured to output the read data and the timing signal synchronously.

14. The apparatus of claim 10, wherein the memory bank includes a data amplifier configured to output the read data in response to an amplifier enable signal, and the timing signal is generated based on the amplifier enable signal.

15. The apparatus of claim 14, wherein the memory cell array further includes a logic circuit configured to process the read data and a replica circuit configured to delay the amplifier enable signal to generate the timing signal.

16. The apparatus of claim 15, wherein the logic circuit includes an error correction circuit configured to correct an error of the read data.

17. An apparatus comprising:

a first circuit configured to output second and third signals when a first period is elapsed after a first signal is received, wherein the second and third signals are different;

a second circuit configured to output fourth signal when a second period greater than the first period is elapsed after the first signal is received;

an input counter coupled to the first circuit and configured to receive the third signal and update an input count value in response to the third signal;

an output counter coupled to the second circuit and configured to receive the fourth signal and update an output count value in response to the fourth signal;

a FIFO circuit having a plurality of registers, the FIFO circuit being configured to store the second signal into one of the registers indicated by an input point value and configured to output the second signal stored in one of the registers indicated by an output point value, and a third circuit coupled to the output counter and configured to control the output counter such that the output counter stops updating the output count value in response to the fourth signal when the first signal is supplied to the first circuit in an inactive state.

18. The apparatus of claim 17, wherein the first circuit is configured to output the second and third signals synchronously.

19. The apparatus of claim 18, wherein the first circuit includes a memory cell array, and wherein the second signal is a read data read from the memory cell array.

20. The apparatus of claim 19, wherein the third signal is a timing signal.

21. The apparatus of claim 1, wherein the output counter is configured to maintain the output count value when the judge signal is in the inactive state regardless of a state of the read command signal.

* * * * *

UNITED STATES PATENT AND TRADEMARK OFFICE
CERTIFICATE OF CORRECTION

PATENT NO. : 11,386,939 B2
APPLICATION NO. : 16/548786
DATED : July 12, 2022
INVENTOR(S) : Ryoki Karashima It is certified that error appears in the above-identified patent and that said Letters Patent is hereby corrected as shown below:

In the Claims

| | Reads | Should Read |
|---|---|---|
| Column 6, Line 34 | "neither the read data nor the tuning signal" | -- neither the read data nor the timing signal -- |

Signed and Sealed this
Eighteenth Day of October, 2022

Katherine Kelly Vidal
*Director of the United States Patent and Trademark Office*